US006797455B2

(12) United States Patent
Hiller et al.

(10) Patent No.: US 6,797,455 B2
(45) Date of Patent: Sep. 28, 2004

(54) RECORDING MATERIAL COMPRISING SILICONE RUBBER AND IRON OXIDES FOR PRODUCING RELIEF PRINTING PLATES BY LASER ENGRAVING

(75) Inventors: Margit Hiller, Karlstadt (DE); Roland Roos, Bobenheim-Roxheim (DE); Heinz Faulhaber, Ludwigshafen (DE)

(73) Assignee: BASF Drucksysteme GmbH, Stuttgart (DE)

( * ) Notice: Subject to any disclaimer, the term of this patent is extended or adjusted under 35 U.S.C. 154(b) by 0 days.

(21) Appl. No.: 10/090,229

(22) Filed: Mar. 5, 2002

(65) Prior Publication Data

US 2002/0136969 A1 Sep. 26, 2002

Related U.S. Application Data

(62) Division of application No. 09/643,727, filed on Aug. 23, 2000, now Pat. No. 6,511,784.

(30) Foreign Application Priority Data

Sep. 3, 1999 (DE) .......................................... 199 42 216

(51) Int. Cl.[7] .......................... G03F 7/075; G03F 7/36; B41C 1/02

(52) U.S. Cl. ........................ 430/306; 430/300; 430/945

(58) Field of Search .................................. 430/300, 306

(56) References Cited

U.S. PATENT DOCUMENTS

| | | | | | |
|---|---|---|---|---|---|
| 3,549,733 | A | | 12/1970 | Caddell | 264/25 |
| 5,378,580 | A | | 1/1995 | Leenders | 430/303 |
| 5,396,841 | A | * | 3/1995 | Guls | 101/395 |
| 5,760,120 | A | | 6/1998 | Itoh et al. | 524/431 |
| 5,798,202 | A | * | 8/1998 | Cushner et al. | 430/306 |
| 6,070,527 | A | | 6/2000 | Yamane et al. | 101/150 |
| 6,096,476 | A | | 8/2000 | Yanagida et al. | 430/273 |

FOREIGN PATENT DOCUMENTS

| | | |
|---|---|---|
| CA | 2229003 | 12/1997 |
| CA | 2279370 | 7/1999 |
| EP | 0 666 184 | 8/1995 |
| EP | 640 043 | 1/1996 |
| EP | 640 044 | 3/1996 |
| EP | 710 573 | 5/1996 |
| JP | 06-118217 | 4/1994 |
| JP | 07070548 | 3/1995 |
| JP | 07081025 | 3/1995 |
| JP | 09150589 | 6/1997 |
| JP | 09244237 | 9/1997 |
| JP | 63092486 | 4/1998 |

OTHER PUBLICATIONS

Tanaka et al., 127:313163; Chem. Abst., ACS (English abstract of JP–09244237, issued Sep. 19, 1997).

Tanaka et al., JP 409244237A, JPO copyright 1997 (English abstract of JP09–244237, issued Sep. 19, 1997).

Toyo INK MFG, Derwent 1997–517161, 1999 (Abstract of JP 09244237, Sep. 19, 1997).

Nishimura et al., 121:3112181, Chem. Abst. (English abstract of JP 06–118217).

Silicone Rubbers and Elastomers, Ullman's Enc. of Ind-.Chem. 6th Ed. 1998.

* cited by examiner

*Primary Examiner*—Cynthia Hamilton
(74) *Attorney, Agent, or Firm*—Keil & Weinkauf

(57) ABSTRACT

A description is given of a laser-engravable recording material for producing relief printing plates, in particular for producing flexographic printing plates, comprising a dimensionally stable support and a recording layer comprising silicone rubbers and inorganic ferrous solids and/or carbon black as absorbers for laser radiation; of processes for producing relief printing plates by laser engraving such recording materials; and of relief printing plates having a printing relief comprising silicone rubbers and inorganic ferrous solids and/or carbon black.

10 Claims, 1 Drawing Sheet

Figure 1:
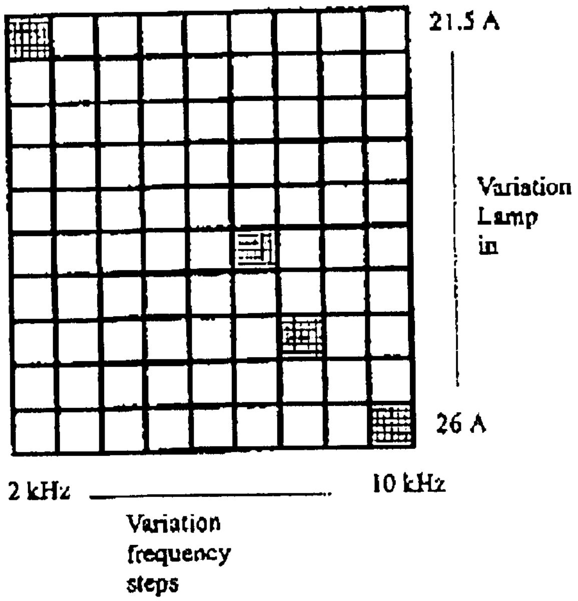

RECORDING MATERIAL COMPRISING SILICONE RUBBER AND IRON OXIDES FOR PRODUCING RELIEF PRINTING PLATES BY LASER ENGRAVING

This application is a divisional of application Ser. No. 09/643,727, filed on Aug. 23, 2000, now U.S. Pat. No. 6,511,784.

The present invention relates to a laser-engravable recording material for producing relief printing plates, in particular for producing flexographic printing plates, comprising a dimensionally stable support and a recording layer comprising silicone rubbers and inorganic ferrous solids and/or carbon black as absorbers for laser radiation. It further relates to a process for producing relief printing plates by laser engraving of such recording materials, and to relief printing plates having a printing relief comprising silicone rubbers and inorganic ferrous solids and/or carbon black.

Increasingly, the conventional technique for producing photopolymeric relief printing plates, flexographic printing plates or gravure printing plates by placing a photographic mask onto a photopolymeric recording element, exposing the element to actinic light through this mask, and washing off the unpolymerized areas of the exposed element with a developer fluid is being replaced by techniques employing lasers. In this context a distinction should be made between essentially two different techniques:

First, it is known to provide photopolymeric relief printing plates with laser-writable layers. These layers consist, for example, of a binder containing dispersed carbon black. By irradiation with a IR laser it is possible to ablate this layer and mark an image into the layer. The image information is transferred directly from the layout computer system to the laser apparatus. From the laser-ablatable layer, therefore, a mask is produced which adheres directly to the photopolymeric printing plate. There is no longer a need for a photographic negative. Subsequently, the printing plate is exposed and developed conventionally, in the course of which the residues of the laser-writable layer are removed as well.

Secondly, in the case of direct laser engraving, depressions are engraved directly into an appropriate plate using a sufficiently powerful laser, in particular an IR laser, to form a relief suitable for printing. Subsequent photopolymerization and development of the plate are not necessary.

A key difference between the techniques depicted lies in the amount of material that must be removed. Whereas the abovementioned laser-writable layers are usually just a few μm thick, so that only small amounts of the materials of which the IR ablative layer is composed must be removed, it is necessary in the case of direct laser engraving to remove large amounts of the material of which the printing relief is composed. A typical flexographic printing plate, for example, is between 0.5 and 7 mm thick and the nonprinting depressions in the plate are between 300 μm and 3 mm deep.

An essential factor for the quality of the printing relief obtained by laser engraving is in particular that under laser irradiation the material passes directly into the gas phase with as far as possible no melting beforehand, since otherwise melt edges are formed around the depressions in the plate. Melt edges of this kind result in a considerable deterioration in the printed image and reduce the resolution of the printing plate and of the printed image.

For the economics of the process it is critical that the sensitivity of the recording material to laser radiation is as high as possible in order that the material can be laser-engraved extremely rapidly. In this context, however, it must be borne in mind that the laser-engravable layer is also required to have the performance properties that are important for relief printing plates, such as elasticity, hardness, roughness, ink acceptance, or low swellability in printing inks, for example. Optimizing the material in terms of laser engravability must certainly not result in any impairment in said performance properties.

Materials for producing relief printing plates by means of direct laser engraving are known in principle.

U.S. Pat. No. 3,549,733 discloses a polyoxymethylene or polychloral recording material for producing printing plates by means of laser engraving. Additionally, glass fibers or rutile can be used as fillers.

DE-A 196 25 749 discloses a seamless printing form (sleeve) for rotary flexographic printing, in which the elastomer layer is formed by a cold-curing silicone polymer or a silicone fluoropolymer, along with aluminum hydroxide as filler.

The sensitivity of the two systems to laser radiation, however, leaves something to be desired, with the consequence that imagewise engraving of the printing plate takes a long time.

EP-A 710 573 discloses a laser-engravable printing plate made from a polyurethane elastomer, nitrocellulose, and carbon black. The high levels of nonelastomeric nitrocellulose (from 25 to 45% by weight of the laser-sensitive layer), however, cause difficulties in the production of flexographic printing plates.

EP-A 640 043 and EP-A 640 044 disclose, respectively, single-layer and multilayer elastomeric laser-engravable elements for producing flexographic printing plates. The elements disclosed consist of "reinforced" elastomeric layers. Binders used are thermoplastic elastomers typical for flexographic printing plates, such as SBS, SIS or SEBS block copolymers, for example. The so-called reinforcement is achieved alternatively by means of fillers, photochemical crosslinking or thermochemical crosslinking, or combinations thereof. In addition, the layer may optionally include substances which absorb IR radiation. A preferred IR-absorbent material is carbon black, which at the same time also acts as filler. The engraving of elements with thermoplastic elastomers as binders using IR lasers, however, is often accompanied by the formation of melt edges, leading to defects in the printed image.

It is an object of the present invention to find an improved material for producing relief printing plates by means of laser engraving, which possesses an increased level of sensitivity to laser radiation and with which relief printing plates without melt edges can be produced.

We have found that this object is achieved by a laser-engravable recording material for producing relief printing plates, in particular for producing flexographic printing plates, comprising a dimensionally stable support and a recording layer comprising silicone rubbers and inorganic ferrous solids and/or carbon black as absorbers for laser radiation. We have also found a process for producing relief printing plates by engraving such recording materials using a laser, and relief printing plates having a printing relief comprising silicone rubbers and inorganic ferrous solids and/or carbon black as absorbers for laser radiation.

The recording material of the invention comprises a laser-engravable layer applied with or without an adhesion layer to a dimensionally stable support. Examples of suitable dimensionally stable supports are plates, films, and conical and cylindrical sleeves made from metals such as steel, aluminum, copper and nickel or from plastics such as polyethylene terephthalate (PET), polyethylene naphthalate (PEN), polybutylene terephthalate, polyamide and polycarbonate, and, if desired, also woven and nonwoven materials, such as glass fiber fabrics, and also composite materials of glass fibers and plastics. Particularly suitable dimensionally stable supports are dimensionally stable support films, examples being polyester films, especially PET or PEN films.

The term "laser-engravable" means that the layer possesses the property of absorbing laser radiation, especially the radiation of an IR laser, so that at those points where it is exposed to a laser beam of sufficient intensity it is removed, or at least detached. Preferably, the layer is vaporized without melting beforehand or is decomposed thermally or oxidatively, so that its decomposition products are removed from the layer in the form of hot gases, vapors, smoke, or small particles. However, the invention also embraces the subsequent mechanical removal of the residues of the irradiated layer by means, for example, of a jet of liquid or of gas, or else, for example, by suction.

The laser-engravable layer comprises at least one silicone rubber as binder. Silicone rubbers are formed by appropriate crosslinking of silicone polymers and are available commercially. Depending on the type of crosslinking, a distinction is made between heat-curing silicone rubbers (HV grades), cold-curing one-component silicone rubbers (RTV-1 grades), cold-curing two-component silicone rubbers (RTV-2 grades), and liquid silicone rubbers (LSR grades). A comprehensive description of silicone rubbers and the various curing techniques can be found, for example, in "Rubbers-5.1. Silicone Rubbers", Ullmann's Encyclopedia of Industrial Chemistry, Sixth Edition, 1998, Electronic Release. The skilled worker will make an appropriate selection from the various types of silicone rubbers in accordance with the desired properties of the printing relief. In order to produce a laser-engravable recording element suitable for producing a flexographic printing plate, for example, the skilled worker will choose a relatively soft rubber, whereas for producing a relief or gravure printing plate he or she will choose harder grades. It is also possible to use blends of two or more silicone rubbers.

In addition, the properties of silicone rubbers can be influenced by means of additives such as fillers or plasticizers. Commercially available silicone rubbers contain in particular up to 50% by weight of pyrogenic or precipitated, unmodified or organically modified silica, quartz or alumina as fillers. Such additives of commercial silicone rubbers should be understood for the purposes of this invention as being included in the term silicone rubber.

It is also possible, furthermore, to use siloxane block copolymers having siloxane blocks and thermoplastic hard segments. Examples of such hard segment blocks are polycarbonate, polysulfone, and polyimide segments. Block copolymers of this kind have the properties of thermoplastic elastomers and for the purposes of this invention should be likewise understood as being embraced by the term silicone rubber.

The laser-engravable layer may, furthermore, include further polymeric binders different than silicone rubber. Additional binders of this kind can be used, for example, for controlled modification of the properties of the elastomeric layer. A prerequisite for the addition of further binders is that they are compatible with the silicone rubber. For example, other rubbers such as ethylene-propylene-diene rubbers are suitable for use as additional binders. The amount of additional binders is chosen by the skilled worker in accordance with the desired properties. Generally speaking, however, not more than 25% by weight, relative to the total amount of the binder used, preferably not more than 10% by weight, of such additional binders should be employed.

The recording layer of the invention further comprises an inorganic ferrous solid and/or carbon black as absorber for laser radiation. It is also possible to use mixtures of two or more absorbers for laser radiation. Suitable absorbers for laser radiation exhibit a high level of absorption in the region of the laser wavelength. Particularly suitable absorbers are those exibiting a high level of absorption in the near infrared and in the longer-wave VIS region of the electromagnetic spectrum. Absorbers of this kind are particularly suitable for absorbing radiation from Nd-YAG lasers (1064 nm) and from IR diode lasers, which typically have wavelengths of between 700 and 900 nm and between 1200 and 1600 nm.

Particularly suitable ferrous solids are intensely colored iron oxides. Iron oxides of this kind are available commercially and are conventionally used as color pigments or as pigments for magnetic recording. Examples of suitable absorbers for laser radiation are FeO, goethite α-FeOOH, akaganeite β-FeOOH, lepidokrokite γ-FeOOH, hematite α-$Fe_2O_3$, maghemite γ-$Fe_2O_3$, magnetite $Fe_3O_4$ or berthollides. It is also possible to use doped iron oxides or mixed oxides of iron with other metals. Examples of mixed oxides are umbra $Fe_2O_3$xn $MnO_2$ or $Fe_xAl_{(1-x)}OOH$, especially various spinel black pigments such as $Cu(Cr,Fe)_2O_4$, $Co(Cr,Fe)_2O_4$ or $Cu(Cr,Fe,Mn)_2O_4$. Examples of dopants are P, Si, Al, Mg, Zn and Cr, for example. Dopants of this kind are generally added in small amounts in the course of the synthesis of the oxides in order to control particle size and particle morphology. The iron oxides can also be in coated form. Such coatings can be applied, for example, in order to improve the dispersibility of the particles. These coatings can, for example, comprise inorganic compounds such as $SiO_2$ and/or AlOOH. It is also possible, however, to apply organic coatings, examples being organic adhesion promoters such as aminopropyl(trimethoxy)silane. Particularly suitable absorbers for laser radiation are FeOOH, $Fe_2O_3$ and $Fe_3O_4$; $Fe_3$O4 is especially preferred.

The size of the ferrous inorganic solids used, especially of the iron oxides, will be selected by the skilled worker in accordance with the desired properties of the recording material. Solids having an average particle size of more than 10 μm, however, are generally unsuitable. Since iron oxides in particular are anisometric, this figure refers to the longest axis. The particle size is preferably less than 1 μm. It is also possible to use what are known as transparent iron oxides, which have a particle size of less than 0.1 μm and a specific surface area of up to 150 $m^2$/g.

Further ferrous compounds suitable as absorbers for laser radiation are metal iron pigments. Particularly suitable are those pigments having a needle or rice-grain shape, with a length of between 0.1 and 1 μm. Pigments of this kind are known for use as magnetic pigments for magnetic recording. In addition to iron, further dopants such as Al, Si, Mg, P, Co, Ni, Nd or Y can be present, or the metal iron pigments can be coated with them. Metal iron pigments are surface-anoxidized for protection against corrosion, and consist of a doped or undoped iron core and a doped or undoped iron oxide shell.

Suitable carbon blacks as absorbers for laser radiation are, in particular, finely divided grades of carbon black having a particle size of between 10 and 50 nm.

The amount of absorber added will be chosen by the skilled worker in accordance with the particular material being used and the desired properties of the recording material. In this context it should be borne in mind that the solids added as absorbers will affect not only the laser engravability but also, for example, the mechanical properties of the recording material, such as its hardness or other properties, e.g., the thermal conductivity. If, therefore, a relief or gravure printing plate harder than flexographic printing plates is to be produced, for example, the skilled worker will generally tend to select higher proportions of fillers than if the production of a flexographic printing plate were intended.

In general, however, more than 45% by weight of absorber, or mixtures of different absorbers, for laser radiation, relative to the sum of all of the constituents of the laser-engravable recording layer, is unsuitable. Preferably, the amount of the absorber for laser radiation is from 0.1 to 20% by weight, and with particular preference from 0.5 to 15% by weight.

In addition to the absorber for laser radiation the laser-engravable recording layer may also include further inorganic materials, especially oxides or oxide hydrates of metals, as fillers. These fillers serve, for example, to control the mechanical properties or the printing properties of the layer. Particular mention should be made here of $SiO_2$, which is already a frequent constituent of commercially available silicone rubbers. Examples of others which can be used include $TiO_2$, metal borides, metal carbides, metal nitrides, metal carbonitrides, metal oxides, and oxides having a bronze structure.

The laser-engravable recording layer can, furthermore, comprise auxiliaries and additives as well. Examples of such additives are colorants, plasticizers, dispersing auxiliaries, and adhesion promoters.

In general, the thickness of the laser-engravable recording layer is between 0.1 and 7 mm. The thickness will be suitably chosen by the skilled worker in accordance with the desired end use of the printing plate. The laser-engravable recording element may also comprise a plurality of laser-engravable recording layers, differing in composition, atop one another.

Optionally, the recording element of the invention may also include a thin top layer on the laser-engravable recording layer. By means of a top layer of this kind it is possible to modify parameters essential for the printing behavior and ink transfer, such as roughness, abrasiveness, surface tension, surface tack or solvent resistance at the surface, without affecting the printing plate properties typical to relief, such as hardness or elasticity, for example. In other words, surface properties and layer properties can be modified independently of one another in order to achieve an optimum print result. The top layer preferably also comprises a silicone rubber as polymeric binder, but may also include, conventionally, SIS or SBS block copolymers, for example. The top layer can comprise an absorber for laser radiation, although need not necessarily do so. The composition of the top layer is restricted only insofar as there must be no adverse effect on the laser engraving of the underlying laser-engravable layer and it must be possible to remove the top layer together with said laser-engravable layer. The top layer should be thin relative to the laser-engravable layer. As a general rule, the thickness of the top layer will not exceed 100 $\mu$m; preferably, its thickness is situated between 5 and 80 $\mu$m, with particular preference between 10 and 50 $\mu$m.

The recording element of the invention may further optionally include a non-laser-engravable bottom layer situated between the support and the laser-engravable layer. Bottom layers of this kind make it possible to modify the mechanical properties of the relief printing plate without affecting the printing plate properties typical of the relief. As binder, the bottom layer may likewise comprise silicone rubbers or other polymers.

In addition, the laser-engravable recording element can optionally be protected against mechanical damage by means of a protective sheet of PET, for example, which is located on the respective topmost layer.

Production of the laser-engravable recording elements of the invention is oriented on the nature of the silicone rubber used. An essential factor for the quality of the recording material of the invention is that the absorber for the laser radiation and all other components are incorporated uniformly in the silicone rubber, so that a homogeneous recording material is formed. They can be produced, for example, by dissolving the starting polymer in an appropriate solvent such as toluene, for example, dispersing the absorber therein, with or without the addition of further auxiliaries, casting the resulting dispersion onto an appropriate support sheet, evaporating the solvent, and crosslinking the silicone polymer. This method is particularly advantageous when a cold-curing one-component system is being used. Furthermore, the recording materials of the invention can be produced, for example, by thoroughly mixing the starting components with one another in the absence of solvents in a dispersing apparatus, such as a compounder or extruder, for example, and shaping the mixture into a plate by means of compression molding, extrusion with a standard or circular die, injection molding, or any appropriate combination of techniques. Depending on the type of silicone rubber used, curing is carried out at room temperature or at elevated temperatures. The production process may also include aftertreatment steps such as calendering or grinding, for example. Steps of this kind are advantageously employed in order to obtain a recording material having an extremely smooth surface.

The laser-engravable recording materials of the invention are used as starting material for producing relief printing plates. The process involves first removing the cover film, if present. In the next step of the process, a printing relief is engraved into the recording material using a laser. Advantageously, the flanks of the image elements engraved drop vertically to start with and spread out only in the lower region of the image element. This provides good shoulder-shaping of the image dots but with low dot gain. Alternatively, image dot flanks with different configurations can be engraved.

Lasers particularly suitable for laser engraving are Nd-YAG lasers (1064 nm), IR diode lasers, which typically have wavelengths of between 700 and 900 nm and of between 1200 and 1600 nm, and $CO_2$ lasers, having a wavelength of 10640 nm. It is also possible, however, to use lasers with shorter wavelengths, provided the laser is of sufficient intensity. For example, a frequency-doubled (532 nm) or frequency-tripled (355 nm) Nd-YAG laser can be used. Laser apparatus of this kind is available commercially. The image information to be engraved is transferred directly from the layout computer system to the laser apparatus. Laser operation can be either continuous or pulsed.

Laser engraving can be carried out advantageously in the presence of an oxygen-containing gas, especially air. The oxygen-containing gas can be blown over the recording element in the course or engraving. A comparatively gentle gas flow can be generated, for example, using a fan. It is also possible, however, to blow a stronger jet over the recording material with the aid of an appropriate nozzle. This embodiment has the advantage that solid constituents of the layer which have become detached can be effectively removed.

Optionally, the printing plate obtained can be cleaned further. A cleaning step of this kind removes constituents of the layer that have become detached but have not yet been completely removed from the surface of the plate. The printing plate can be cleaned, for example, using a brush. This cleaning process can be assisted by a suitable aqueous and/or organic solvent. A suitable solvent will be chosen by the skilled worker subject to the proviso that it does not dissolve or strongly swell the relief layer.

Alternatively, cleaning can be carried out, for example, with compressed air or by suction.

Although the recording materials of the invention are intended for laser engraving, the present invention also embraces mechanical engraving of the recording materials; that is, engraving by means, for example, of appropriate blades or other engraving tools.

With the process of the invention, relief printing plates are obtained whose printing relief has the same composition as the laser-engravable recording layer of the abovementioned recording element.

The examples which follow are intended to illustrate the invention, but do not restrict its scope.

Experimental details:

The engraving tests were carried out using a pulsed Nd-YAG laser (model: FOBA-LAS 94S, from Foba GmbH, Elektronik+Lasersysteme) having a wavelength of 1064 nm. A 2 mm mode diaphragm was used, and the velocity of the laser beam was 100 mm/s.

A pattern of 90 square engraving elements having an edge length of 2 mm each was engraved into the recording materials. The engraved elements were each separated from one another by thin webs of unengraved material (see FIG. 1). Both the laser output (by altering the lamp current) and the pulse frequency of the laser were increased in steps from one engraved element to the next. To engrave the entire pattern into the recording material took about 60 s. In each case the depth of 4 elements was evaluated, including the elements with lowest laser output and lowest pulse frequency and those with highest laser output and highest pulse frequency. The respective data are given in Table 1.

EXAMPLE 1

High temperature crosslinking silicone rubber 96 parts by weight of a high temperature crosslinking (HTV) silicone rubber (Elastosil® R, type R 300/30S, from Wacker) were admixed with 2 parts by weight of an initiator (Lucidol S50S, dibenzoyl peroxide in silicone oil, from Wacker) and with 2 parts by weight of a predispersed iron oxide (type H1, from Wacker, 60% by weight of $Fe_2O_3$ in 40% by weight silicone rubber), and the components were mixed intensively with one another until a homogeneous composition was formed. Calendering was carried out to produce a sheet which was subsequently processed in a press to form a plate and crosslinked at 135° C./50 bar for 10 minutes. Plates with a thickness of from 1 to 10 mm were obtained depending on the press frame used. The plates were subsequently heat-treated at 200° C. for 4 hours. The plate obtained was thereafter ablated as described above at different pulse frequencies and lamp current strengths. The individual elements ere engraved cleanly and without melt edges. The results are summarized in Table 1.

EXAMPLE 2

The procedure of Example 1 was repeated but replacing the high temperature crosslinking silicone rubber of type R 300/30S by type R 201/80, which has a higher filler content, a higher level of crosslinking and a higher Shore hardness. Crosslinking was carried out at 150° C.

EXAMPLE 3

Cold-crosslinking one-component silicone rubber parts by weight of finely divided $\alpha$-$Fe_2O_3$ were predispersed in a mixture of silicone oil and toluene, this dispersion was added to 90 parts by weight of a cold-crosslinking one-component (RTV-1) silicone rubber (Elastosil® E 41, gives off acetic acid on curing, from Wacker) in solution in toluene (20% by weight based on the Elastosil), and the mixture of silicone rubber and filler was stirred thoroughly. The mixture was knife-coated onto a PET film, the solvent was evaporated and the coated film was then allowed to cure at room temperature. The resulting plate was subsequently ablated as described above at different pulse frequencies and lamp current strengths. The results are summarized in Table 1.

EXAMPLES 4 TO 9

Example 3 was repeated but using different iron oxides as fillers. The results are summarized in Table 1.

EXAMPLES 10 TO 12

Example 3 was repeated but using carbon black or mixtures of $\alpha$-$Fe_2O_3$ and carbon black (Printex U, from Degussa) as fillers. The results are summarized in Table 1.

EXAMPLE 13

Cold-crosslinking two-component silicone rubber (RTV-2)

98 parts by weight of a component A, containing 1.5 parts by weight of $Fe_2O_3$, of the two-component silicone rubber (Elastosil® RT 426, from Wacker, Munich) were mixed thoroughly with 2 parts by weight of component B (Härter T-40 [curing agent], from Wacker). The mixture was cast to form a plate, and cured at room temperature.

The resulting plate was subsequently ablated as described above at different pulse frequencies and lamp current strengths. The results are summarized in Table 1.

EXAMPLE 14

The procedure of Example 13 was repeated but using 97 parts by weight of A and 3 parts by weight of B.

The resulting plate was subsequently ablated as described above at different pulse frequencies and lamp current strengths. The results are summarized in Table 1.1

EXAMPLE 15

The procedure of Example 13 was repeated but using 96 parts by weight of A and 4 parts by weight of B.

The resulting plate was subsequently ablated as described above at different pulse frequencies and lamp current strengths. The results are summarized in Table 1.

EXAMPLE 16

A silicatic pigment containing iron and coated with carbon black (Ebony Novacite® Malvern Minerals Company, iron content approx. 1.6% carbon approx. 3%) was dispersed in the A component of the silicone rubber Elastosil® RT 601 (from Wacker) by adding SAZ beads and using a shaker machine (Red Devil) for 6 h. The dispersion was subsequently mixed with Elastosil® RT 601-A and Elastosil® RT 601-B, to give a ratio of the A component to the B component of 9:1. The mixture contained 10% by weight of the pigment. The mixture was cast into a mold and cured.

The resulting plate was subsequently ablated as described above at different pulse frequencies and lamp current strengths. The results are summarized in Table 1.

EXAMPLE 17

Use of liquid silicone rubber

Elastosil® LR 3094/60 A was mixed with the B component in a ratio of 1:1 and with additional carbon black (room temperature) (the A component already contains carbon black) and the black mass was cast into molds. The total carbon black content was 10% by weight. Subsequently, crosslinking was carried out in a drying oven at 150° C. for 3 h.

The resulting plate was subsequently ablated as described above at different pulse frequencies and lamp current strengths. The results are summarized in Table 1.

Printing tests were carried out with the resulting flexographic printing plates, using different flexographic printing inks. Both UV-curable printing inks (UV Flexocure 300, Akzo Nobel) and solvent-based and water-based flexographic printing inks were used. Ink transfer and print resolution were good.

Comparative Example 1

Example 3 was repeated without adding iron oxide as filler. The resulting plate was subsequently exposed as described above to a laser beam at different pulse frequencies and lamp current strengths. The resulting plate was not laser-engravable. The results are summarized in Table 2.

Comparative Examples 2 and 3

Example 3 was repeated but using the colorless inorganic materials $Al_2O_3$ and $Al(OH)_3$ as fillers. The resulting plate was not laser-engravable. The material had only foamed up, and had undergone partial black discoloration.

Comparative Example 4

Example 3 was repeated but using colorless $TiO_2$ as filler. The plate was laser-engravable, but the sensitivity of the plate to the laser was less than in the case of Example 3.

Comparative Example 5

15 parts by weight of carbon black were mixed intensively with 85 parts by weight of natural rubber in a compounder and the mixture was subsequently calendered. The resulting plate was subsequently ablated as described above at different pulse frequencies and lamp current strengths. The plate lent itself poorly to ablation. The engraved elements had melt edges. In addition, the surface tack of the plate increased as a result of irradiation with the laser. The results are summarized in Table 2.

Comparative Example 6

The procedure of Comparative Example 2 was repeated except that the natural rubber contained 2.4% S as crosslinker and was crosslinked in a press at 140° C. at 50 bar for 20 minutes. The thickness of the plate was 4 mm. The engraved elements had melt edges and the surface tack increased.

Comparative Example 7

In accordance with the teaching of EP-A 640 043, 10 parts by weight of carbon black (Printex U, from Degussa) and 90 parts by weight of a styrene-isoprene-styrene block copolymer (Kraton®1161, from Shell) were mixed intensively with one another in a compounder and the mixture was shaped to a plate in a press at 150° C. and 150 bar. The resulting plate was subsequently ablated as described above at different pulse frequencies and lamp current strengths. The sensitivity was markedly better than in the case of comparative experiments 5 and 6, but the engraved elements did have melt edges. The surface tack of the laser-engraved plate was higher than before laser irradiation. The results are summarized in Table 2.

TABLE 1

Results of the experiments; ">" indicates that the entire material was ablated down to the support film; using a thicker plate, therefore, it would be possible to engrave even deeper structures.

| | | Filler | | Engraved depth [μm] | | | | |
|---|---|---|---|---|---|---|---|---|
| Ex. No. | Rubber | Type | Amount[% by wt.] | 21.5 A 2 KHz | 24 A 7 KHz | 25 A 8 KHz | 26 A 10 KHz | Notes |
| Ex. 1 | HT crosslinking, Elastosil ® R 300/30S | $Fe_2O_3$ | 1.2% | 86 | 435 | 545 | 650 | |
| Ex. 2 | HT crosslinking, Elastosil ® R 201/80 | $Fe_2O_3$ | 1.2% | 100 | 430 | 490 | 650 | |
| Ex. 3 | Cold-crosslinking, (RTV-1), Elastosil ® E 41 | α-$Fe_2O_3$ | 10% | 145 | 570 | 700 | >930 | |
| Ex. 4 | Cold-crosslinking (RTV-1), Elastosil ® E 41 | α-$Fe_2O_3$ (Bayferrox 160 FS) | 10% | 145 | 525 | >710 | >710 | |
| Ex. 5 | Cold-crosslinking (RTV-1), Elastosil ® E 41 | α-$Fe_2O_3$ (Bayferrox 105 M) | 10% | 114 | 490 | 590 | >720 | |
| Ex. 6 | Cold-crosslinking (RTV-1), Elastosil ® E 41 | α-FeOOH (Bayferrox 3910) | 10% | 128 | 500 | 590 | 715 | |
| Ex. 7 | Cold-crosslinking (RTV-1), Elastosil ® E 41 | α-$Fe_2O_3$ (Sicotrans L 2915 D) | 10% | 100 | 550 | >690 | >690 | |
| Ex. 8 | Cold-crosslinking (RTV-1), Elastosil ® E 41 | α-$Fe_2O_3$ (Sicotrans L 2715 D) | 10% | 80 | 600 | >690 | >690 | |
| Ex. 9 | Cold-crosslinking (RTV-1), Elastosil ® E 41 | $Fe_3O_4$ (Magnetschwarz Black DK 8569) | 10% | 135 | >690 | >690 | >690 | |
| Ex. 10 | Cold-crosslinking (RTV-1), Elastosil ® E 41 | carbon black | 10% | 250 | 500 | >710 | >710 | |
| Ex. 11 | Cold-crosslinking (RTV-1), Elastosil ® E 41 | α-$Fe_2O_3$ + carbon black | 5% + 5% | 186 | 580 | 640 | >860 | |
| Ex. 12 | Cold-crosslinking (RTV-1), Elastosil ® E 41 | α-$Fe_2O_3$ + carbon black | 10% + 10% | 160 | 490 | 550 | >750 | |
| Ex. 13 | Cold-crosslinking (RTV-2), Elastosil ® RT 426 | $Fe_2O_3$ | 1.5% | 168 | 485 | 585 | 615 | 2% by weight of curing agent |
| Ex. 14 | Cold-crosslinking (RTV-2), Elastosil ® RT 426 | $Fe_2O_3$ | 1.5% | 160 | 470 | 560 | 640 | 3% by weight of curing agent |
| Ex. 15 | Cold-crosslinking (RTV-2), Elastosil ® RT 426 | $Fe_2O_3$ | 1.5% | 180 | 510 | 610 | 645 | 4% by weight of curing agent |

TABLE 1-continued

Results of the experiments; ">" indicates that the entire material was ablated down to the support film; using a thicker plate, therefore, it would be possible to engrave even deeper structures.

| | | Filler | | Engraved depth [$\mu$m] | | | | |
|---|---|---|---|---|---|---|---|---|
| Ex. No. | Rubber | Type | Amount[% by wt.] | 21.5 A 2 KHz | 24 A 7 KHz | 25 A 8 KHz | 26 A 10 KHz | Notes |
| Ex. 16 | Cold-crosslinking (RTV-2), Elastosil ® RT 601 | Ebony Novacite ® | 10% | 300 | 1120 | 1245 | 1480 | |
| Ex. 17 | Elastosil ® LR 60 | carbon black | 10% | 600 | 1350 | 1600 | 1630 | |

TABLE 2

Results of the comparative experiments

| | | Filler | | Engraved depth [$\mu$m] | | | | |
|---|---|---|---|---|---|---|---|---|
| Ex. Number | Rubber | Art | Amount [% by wt] | 21.5 A 2 KHz | 24 A 7 KHz | 25 A 8 KHz | 26 A 10 KHz | Notes |
| Comparative Ex. 1 | Cold-crosslinking (RTV-1), Elastosil ® E 41 | No iron oxide | — | — | — | — | — | laser engraving not possible, only bubbles |
| Comparative Ex. 2 | Cold-crosslinking (RTV-1), Elastosil ® E 41 | $Al_2O_3$ | 10% | — | — | — | — | only bubbles, blackening |
| Comparative Ex. 3 | Cold-crosslinking (RTV-1), Elastosil ® E 41 | $Al(OH)_3$ | 10% | — | — | — | — | only bubbles, blackening |
| Comparative Ex. 4 | Cold-crosslinking (RTV-1), Elastosil ® E 41 | $TiO_2$ | 10% | 69 | 290 | 330 | 390 | |
| Comparative Ex. 5 | Natural rubber, not crosslinked | carbon black | 15% | 44 | 260 | 300 | 370 | melt edges |
| Comparative Ex. 6 | Natural rubber, crosslinked | carbon black | 15% | 28 | 250 | 330 | 390 | melt edges |
| Comparative Ex. 7 | SIS block copolymer (Kraton ® 1161) | carbon black | 10% | 30 | 390 | 520 | 610 | melt edges |

The tests show that recording materials containing iron oxides lend themselves better to laser engraving than do those without iron oxides. Silicone rubber without fillers cannot be laser-engraved at all. Even small amounts of iron oxides considerably increase the capacity for engraving by laser. Colorless aluminum oxides or aluminum oxide hydrates, although they greatly improve the absorption of laser radiation, do not result in a good printing relief. Plates with $TiO_2$ are laser-engravable, but the results are much poorer than when iron oxides are used.

Carbon black-filled elastomers such as natural rubber or SIS block copolymers in accordance with the prior art can be engraved with lasers, but the results are poorer than in the case of the recording materials of the invention. A particular disadvantage are the melt edges which occur.

By contrast, carbon black gives good results when used as sole absorber in silicone rubbers.

We claim:

1. A process for producing a relief printing plate from a laser-engravable material, which comprises engraving a relief image into a laser-engravable recording material using a laser, which recording material comprises a dimensionally stable support and a laser- engravable recording layer comprising at least one polymeric binder and at least one absorber for laser radiation, wherein said polymeric binder is at least one silicone rubber and said absorber is a ferrous inorganic solid and/or carbon black, and wherein said laser-engravable recording layer has a thickness between 0.1 to 7 mm, and wherein the amount of silicon rubber is at least 75% by weight, relative to the total amount of binder used.

2. The process of claim 1 wherein the laser-engravable recording layer has a thickness between 0.5 to 7 mm.

3. The process of claim 1 wherein the recording material includes a removable cover sheet which is removed prior to the engraving with the laser.

4. The process of claim 1 wherein the process is conducted in the presence of an oxygen containing gas.

5. A The process of claim 1 wherein said absorber is an iron oxide selected from the group consisting of FeOOH, $FE_2O_33$ or $Fe_3O_4$.

6. The process of claim 1 wherein said recording layer includes further inorganic fillers.

7. The process of claim 1 wherein said recording material includes an additional top layer which is also removed during the engraving with a laser.

8. The process of claim 7 wherein said top layer includes an absorber for laser radiation.

9. The process of claim 1 wherein said recording material comprises an additional bottom layer between the support and the laser-engravable recording layer.

10. The process of claim 1 wherein a flexographic printing plate is formed.

* * * * *